United States Patent [19]

Kuronen

[11] 3,917,983

[45] Nov. 4, 1975

[54] MULTIWAFER ELECTRICAL CIRCUIT CONSTRUCTION AND METHOD OF MAKING

[75] Inventor: John Michael Kuronen, Woodland Hills, Calif.

[73] Assignee: Bunker Ramo Corporation, Oak Brook, Ill.

[22] Filed: Nov. 12, 1973

[21] Appl. No.: 415,102

[52] U.S. Cl. ............ 317/101 CM; 29/194; 29/197; 29/470.1; 29/472.3

[51] Int. Cl.² .......................................... H05K 5/00

[58] Field of Search ............ 317/101 CM; 174/685; 29/194, 197, 470.1, 472.3; 156/3

[56] References Cited

UNITED STATES PATENTS 3,499,219 3/1970 Griff et al. .................. 317/101 CM
3,704,455 11/1972 Scarbrough ................ 317/101 CM

FOREIGN PATENTS OR APPLICATIONS 1,136,753 12/1968 United Kingdom ........ 317/101 CM
1,210,321 10/1970 United Kingdom ......... 317/101 CM

*Primary Examiner*—David Smith, Jr.
*Attorney, Agent, or Firm*—Norton Lesser; F. M. Arbuckle

[57] ABSTRACT

A construction and method of fabricating a multiwafer electrical circuit structure comprised of a plurality of malleable electrically conductive wafers providing X, Y and Z coaxial connections. The wafers are stacked together under pressure with deformable integral malleable contacts being provided between adjacent wafers for providing wafer-to-wafer Z-axis electrical connections as well as wafer-to-wafer ground connections. The wafers are fabricated from conductive sheets of appropriate malleability in a manner so that the deformable integral malleable Z-axis and ground contacts required between adjacent wafers are fabricated directly from the wafer material.

27 Claims, 6 Drawing Figures

MULTIWAFER ELECTRICAL CIRCUIT CONSTRUCTION AND METHOD OF MAKING

BACKGROUND OF THE INVENTION

This invention relates generally to improved constructions and fabrication methods for a multiwafer electrical circuit packaging structure.

Considerable effort has been expended in recent years in the search for practical, reliable and economic techniques for packaging and interconnecting the components of complex high speed electronic systems. The design objectives of these packaging efforts have been, among other things, to maximize the utilization of space, provide a high degree of interconnection reliability, provide wide bandwidth interconnections usable at high frequencies, minimize cross talk, and assure adequate heat removal, while at the same time providing economical methods of fabrication.

A considerable step forward towards achieving the above design objectives is made possible by the particularly advantageous multiwafer construction and fabrication methods disclosed in the commonly assigned U.S. Pat. No. 3,705,332. It is a primary purpose of the present invention to provide further improvements in the construction and fabrication of a multiwafer structure of this type.

The aforementioned U.S. Pat. No. 3,705,332 discloses a multiwafer packaging structure typically comprised of one or more electrically conductive plates or wafers stacked together under pressure to form a parallelpiped structure containing one or more active components (e.g., integrated circuit chips) as well as conductor means providing coaxially shielded interconnections in X, Y and Z-axis directions, the Z-axis direction being perpendicular to the wafer planes and the X-Y axis directions being parallel thereto. In order to provide Z-axis and ground interconnections between adjacent wafers, the embodiment disclosed in the aforementioned patent provides deformable malleable contacts more malleable than the wafer material which are deposited at appropriate locations of one of the opposed wafer surfaces of each pair of adjacent wafers in the stack. These malleable contacts are deformed when the wafers are stacked under pressure so as to provide reliable wafer-to-wafer Z-axis connections as well as wafer-to-wafer ground connections through the stack.

SUMMARY OF THE PRESENT INVENTION

In accordance with the present invention, an improved wafer construction and method of making are provided whereby the wafers are fabricated from malleable conductive sheets in a manner so that the required Z-axis deformable malleable contacts as well as the deformable malleable contacts required for wafer-to-wafer ground connections are formed directly from and integral with the wafer material, there thus being no need to deposit these malleable contacts as in the preferred embodiment disclosed in the aforementioned patent. Such a construction permits providing the required malleable contacts with considerably greater accuracy and reliability. The use of malleable conductive wafers also achieves the further advantage of providing a more compliant resultant stack having improved pressure distribution and greater mechanical integrity.

The specific nature of the invention as well as other objects, advantages, features and uses thereof will become evident from the following description of preferred embodiments of the invention taken in conjunction with the accompanying drawings.

DETAILED DESCRIPTION

Like numerals refer to like elements throughout the figures of the drawings.

Figure 1:
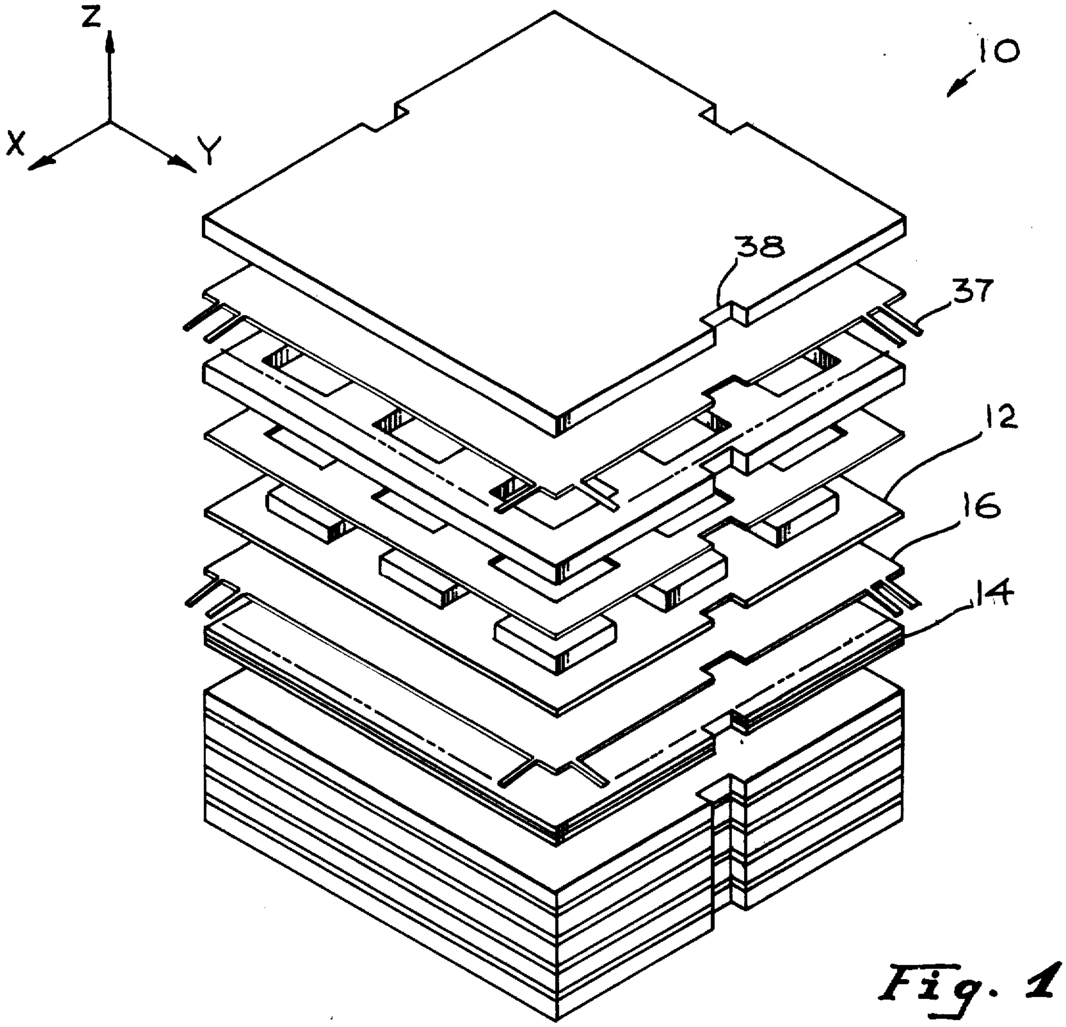
FIG. 1 is a partially disassembled perspective view of a multiwafer electrical circuit structure which may advantageously incorporate the present invention.
Figure 2:
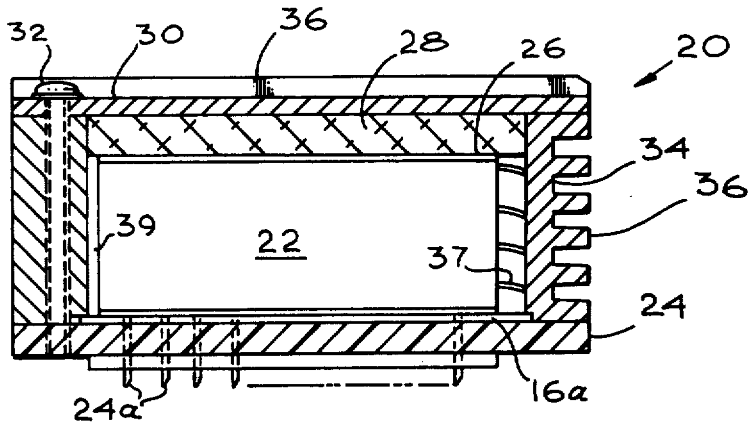
FIG. 2 is a sectional view illustrating how the multiwafer structure of FIG. 1 may typically be pressure stacked within a suitable housing.

Attention is initially directed to FIGS. 1 and 2 which are identical to those contained in the aforementioned U.S. Pat. No. 3,705,332 whose disclosure is to be considered as incorporated herein.

FIG. 1 illustrates a partially dissembled multiwafer electrical circuit structure to which the present invention may advantageously be applied. Such an electrical circuit structure is implemented by stacking a multiplicity of conductive wafers fabricated so as to cooperate with one another to form desired coaxial connections in X, Y and Z-axis directions. In the preferred embodiment disclosed in the aforementioned patent, the wafer stack 10 illustrated in FIG. 1 is comprised of a plurality of different wafers which essentially fall into the following three classes: component wafers 12, interconnections wafers 14, and connector wafers 16. A component wafer 12 is used to physically support and provide electrical connection to active circuit devices such as integrated circuit chips, LSI chips, etc. Each component wafer 12 provides means for connecting the terminals of the active device to Z-axis conductors or slugs for interconnection to adjacent wafers. The interconnection wafers 14 are fabricated so as to include Z-axis slugs as well as X-Y conductors extending in the plane of the wafer. The connector wafers 16 provide a uniform matrix of Z-axis slugs forming through-connections. Deformable malleable contacts are provided between Z-axis slugs of adjacent wafers for providing wafer-to-wafer interconnections when the wafers are pressure stacked. Deformable malleable contacts are also provided between surfaces of adjacent wafers at appropriate locations for providing wafer-to-wafer ground connections so as to achieve essentially coaxial shielding of the X, Y and Z connections within the stack.

FIG. 2 illustrates how the wafer stack 10 of FIG. 1 may typically be mounted within a suitable metallic housing 20. More particularly, FIG. 2 illustrates a wafer stack 10 mounted in the housing 20 between a connector block 24 and a top pressure plate 26. The connector block 24 contains insulated through-conductor output terminal pins 24*a* electrically coupled to the stack 10 by an output connector wafer 16*a* so as to thereby permit convenient electrical connection of the stack and housing to external electrical circuitry. The stack is held under pressure in the Z-axis direction by a resilient pressure pad 28 bearing against the plate 26. The pressure pad 28 is held compressed by a cover plate 30 secured by bolt 32. The cover plate 30 and the housing walls 34 are provided with spaced elongated fins 36 projecting perpendicularly outwardly therefrom. The fins 36, of course, function to maximize heat transfer from the housing 20 to the surrounding cooling medium. In order to provide good heat transfer from the stack 10 of FIG. 1 to the housing walls, a plurality of wafers, such as the connector wafers, are provided with resilient fingers 37 preferably formed integral with the wafers, extending outwardly from the wafer periphery. Upon insertion of the stack into the housing, the fingers contact the inner surface of the housing walls, as shown in FIG. 2, to thus provide a good heat transfer path thereto. In order to laterally align the stack 10 in the housing 20, the wafers are provided with keyways 38 (FIG. 1) adapted to mate with key projections 39.

As previously pointed out, the wafers illustrated in FIG. 1 can be considered as comprising three types: component wafers 12, interconnection wafers 14, and connector wafers 16. All of these wafers are typically similar in construction inasmuch as each essentially comprises a wafer of conductive material such as copper having portions within the profile thereof isolated electrically from the remainder of the wafer so as to provide the required X, Y and Z interconnections. Particular constructions and methods of fabrication for these wafers, including the Z-axis and ground malleable contacts required for wafer-to-wafer connections, are described in detail in the aforementioned patent.

In accordance with the present invention, a particularly advantageous modified construction and fabrication method are provided for forming the wafers of the multiwafer structure of FIGS. 1 and 2, a preferred construction and fabrication method being illustrated in FIGS. 3–6. Although FIGS. 3–6 are specifically directed to the construction and fabrication of an interconnection wafer 14 in accordance with the invention, it will become readily evident from the description provided how the construction and fabrication of the present invention may also be employed for the other wafers of the multiwafer structure of FIGS. 1 and 2.

Figure 3:
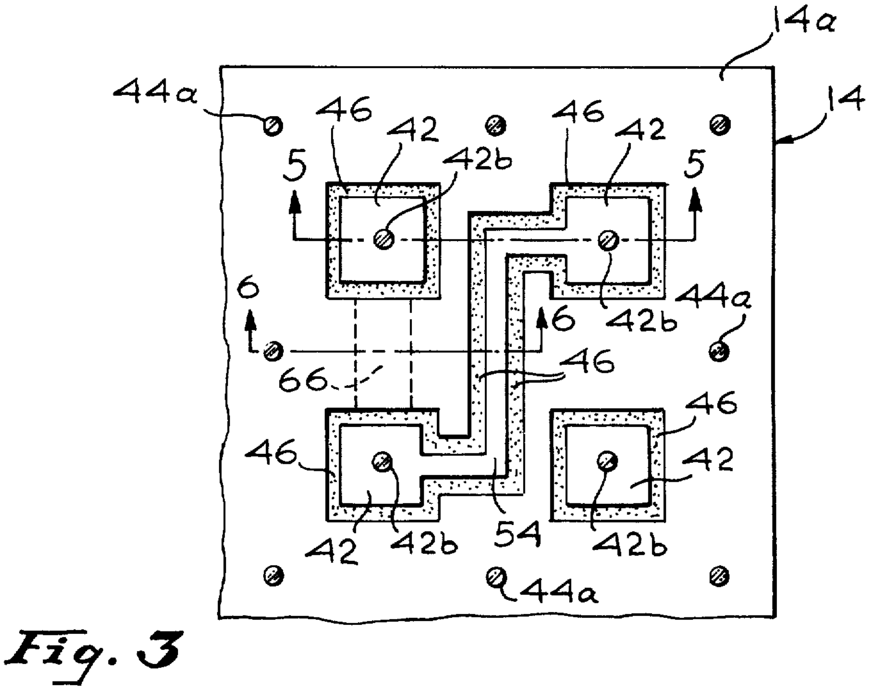
FIGS. 3 and 4 are fragmentary top and bottom views, respectively, of a wafer fabricated in accordance with the present invention.
Figure 4:
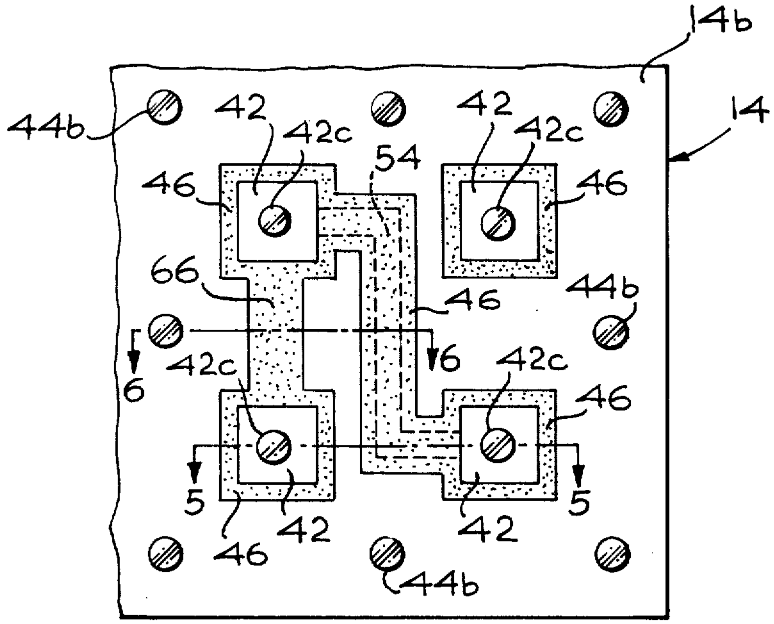
Figures 5, 6:
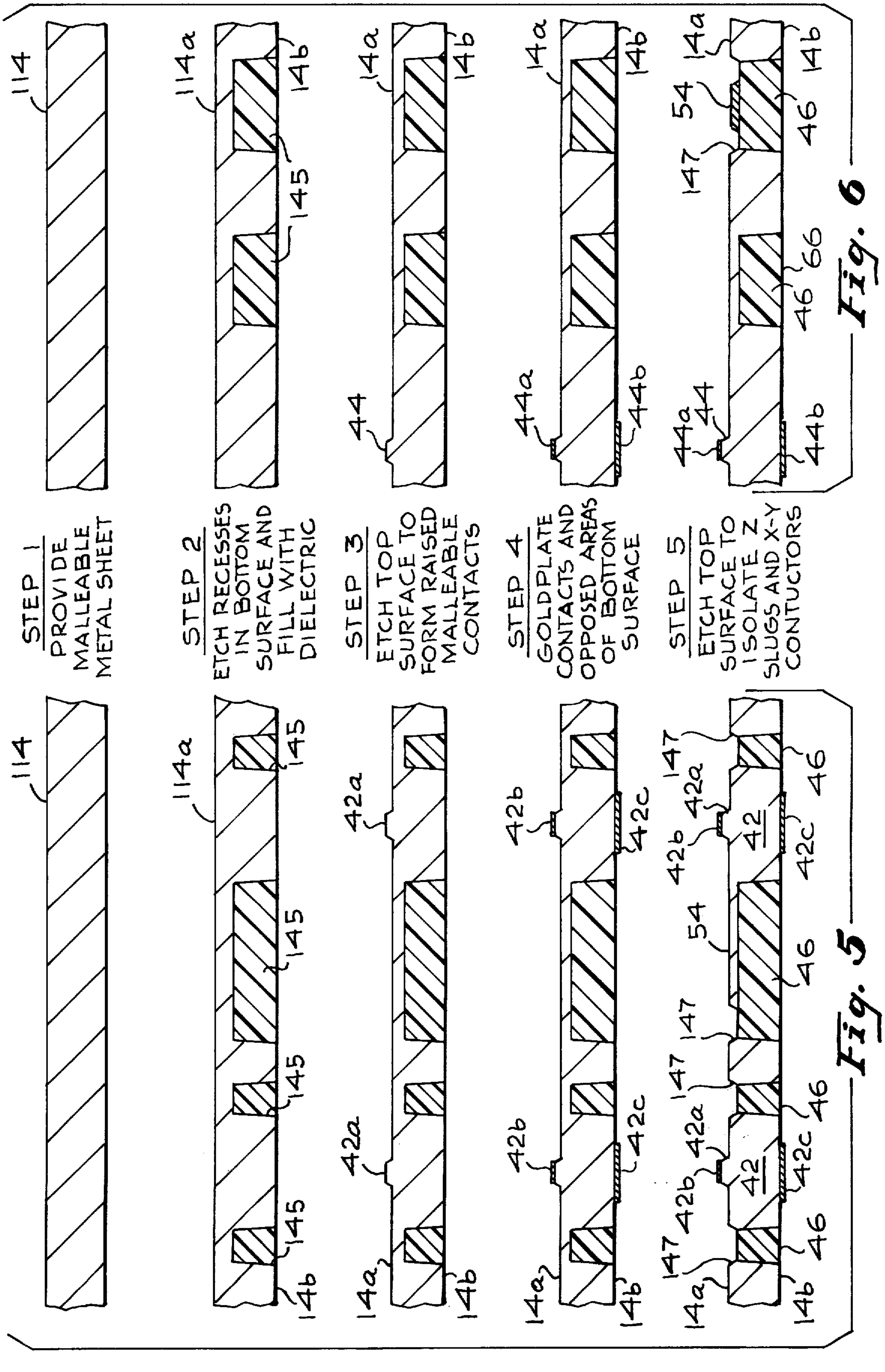
FIGS. 5 and 6 are a series of fragmentary sectional views taken along the lines 5—5 and 6—6, respectively, in FIGS. 3 and 4 illustrating fabrication steps in accordance with the invention.

FIGS. 3 and 4 are respectively top and bottom views of a fragmentary portion of a typical interconnection wafer 14 fabricated from a sheet of conductive malleable material in accordance with the invention. Step 5 of FIGS. 5 and 6 illustrate cross-sections of the interconnection wafer 14 of FIGS. 3 and 4 taken along the lines 5—5 and 6—6. The interconnection wafer 14 includes a plurality of Z-axis slugs 42 formed within the profile thereof. Each Z-axis slug 42 constitutes an electrically insulated through-connection extending between the top and bottom wafer surfaces 14*a* and 14*b* and isolated from and supported relative to the wafer by dielectric material 46. The Z-axis slugs 42 on the interconnection wafer 14 are preferably arranged in a uniform rectangular pattern and may, for example, be located on 50 mil centers in both the X-axis and Y-axis directions.

In order to provide for wafer-to-wafer Z-axis electrical connections, the upper end of each Z-axis slug 42 is provided with deformable integral malleable Z-axis contact 42*a* projecting from the top surface 14a and having a thin electroplated gold layer 42*b* (FIG. 5, step 5). The lower end of each Z-axis slug 42 is provided with a thin electroplated gold layer 42*c* for receiving an opposed malleable Z-axis contact of an adjacent wafer when the wafers are stacked. In order to provide for wafer-to-wafer ground connections, deformable integral malleable contacts 44, each having a thin electroplated gold layer 44*a*, are also provided projecting from and integral with the top wafer surface 14*a*. The opposite areas on the bottom wafer surface 14*b* are each provided with a thin electroplated gold layer 44*b* for receiving an opposed malleable ground contact of an adjacent wafer when the wafers are stacked. It will be noted from FIGS. 3, 4, 5 and 6 that the thin malleable contact or layer areas 42*c* and 44*b* deposited on wafer surface 14*b* are in registration with malleable contacts 42*a* and 44 on the surface 14*a* of an adjacent wafer as illustrated by wafers 114 in FIGS. 5 and 6 and are of greater or different area than contacts 42*a* and 44 to ensure proper registration and engagement therebetween.

Still with reference to FIGS. 3 and 4 and step 5 of FIGS. 5 and 6, the interconnection wafer 14 may also include one or more X-Y conductors 54 provided within the wafer profile for electrically connecting the Z-axis slugs 42 of the wafer in a predetermined manner. Each X-Y conductor 54 is elongated in the plane of the wafer and isolated from and supported relative to the wafer by dielectric material 46.

It is to be noted from FIGS. 3 and 4, and particularly step 5 of FIGS. 5 and 6, that an X-Y conductor 54 fabricated using the particular fabrication method illustrated in FIGS. 5 and 6 will have its upper surface flush with the top wafer surfaces 14*a*. Although it is within the scope of this invention for the X-Y conductor to be provided recessed from both wafer surfaces, a more economical fabrication is possible when the upper surface of the X-Y conductor 54 is provided flush with a wafer surface as shown. Such a flush construction for the X-Y conductor 54 is readily and economically accommodated by providing the opposed surface of the adjacent wafer with an aligned dielectric path of sufficient width to prevent the flush surface of the X-Y conductor from making electrical contact to the adjacent wafer when the wafers are stacked. A typical dielectric path 66 is illustrated in FIGS. 3 and 4 and step 5 in FIG. 6. It will be understood that the particular path chosen for the dielectric path 66 corresponds to that of the path of the opposed flush X-Y conductor on the adjacent wafer (not shown). As will be evident from step 5 of FIG. 6, each such dielectric path 66 is typically provided by forming a dielectric-filled channel following the desired path in the bottom wafer surface 14*b*.

Considering now the coaxial nature of the Z-axis slugs and the X-Y conductors in the resulting structure, it will be appreciated that, a portion of the coaxial shielding of each Z-axis slug and X-Y conductor is provided by the surrounding conductive material of its respective wafer, the coaxial shielding being completed by the adjacent conductive wafers when the wafers are stacked. Accordingly, the number, size and spacings of the Z-axis slugs 42, the X-Y conductors 54 and the dielectric paths 66 are chosen with respect to the operating frequency range so that the X, Y and Z interconnections within the stack effectively constitute coaxial connections.

Attention is now directed to the steps illustrated in FIGS. 5 and 6 which illustrate a preferred method for fabricating the interconnection wafer 14 illustrated in FIGS. 3 and 4. As pointed out previously herein, it will readily become evident from FIGS. 5 and 6 and the associated description provided herein how the other types of wafers of the multiwafer structure of FIG. 1 may also be fabricated employing the principles of the present invention.

As shown in step 1 of FIGS. 5 and 6, a sheet or wafer 114 of malleable conductive material of typically 5 mils is initially provided which may, for example, be malleable copper or aluminum. An appropriate malleability for the conductive sheet 114 is obtainable in accordance with the invention by making the sheet of a conductive material having a Brinell hardness value within the range of 20 to 150.

As indicated in step 2 of FIGS. 5 and 6, selective chemical etching and dielectric filling is employed to simultaneously form relatively deep dielectric filled channels 145 in the bottom wafer surface 114*b* typically extending about four-fifths through the wafer and located in correspondence with the desired pattern of Z-axis slugs 42, X-Y conductors 54 and dielectric paths 66 in the completed wafer illustrated in FIGS. 3 and 4 and step 5 of FIGS. 5 and 6.

As illustrated in step 3 of FIGS. 5 and 6, the top wafer surface 114*a* is then selectively chemically etched so as to simultaneously form a predetermined pattern of small integral malleable contacts 42*a* and 44 of typically 5 mils in diameter projecting from the surface 14*a* by typically 1 mil and located as required for the completed wafer illustrated in FIGS. 3 and 4 and step 5 of FIGS. 5 and 6.

As illustrated in step 4 of FIGS. 5 and 6, a thin gold layer 42*b* and 44*a* of typically 0.2 mils is then deposited on the metal contacts 42*a* and 44, such as by electroplating. Also, thin gold layer areas 42*c* and 44*b* of greater area than contacts 42*a* and 44 are simultaneously deposited at selected locations on the bottom wafer surface having dimensions and a pattern as required for receiving and making good electrical connection with the malleable contacts of the lower adjacent wafer when the wafers are stacked.

The completed cross-sectional wafer structure illustrated in step 5 of FIGS. 5 and 6 is then obtained by selectively chemically etching the top wafer surface 14*a* so as to form channels 147 therein having a depth extending to the channels 145 ecthed in the bottom surface 14*b*during step 2 and dimensioned so as to complete formation of the particular isolated metal wafer portions constituting the Z-axis slugs 42 and the X-Y conductors 54.

It is to be noted in step 5 of FIG. 6 that, as pointed out previously herein, the dielectric path 66 is provided to prevent shorting out of an opposed X-Y conductor in the adjacent wafer. Thus, it will now be evident that such a dielectric path 66 can simply and economically be provided during step 2 merely by selectively etching appropriate dielectric channels therefor in the bottom wafer surface 14*b* at the same time as selectively etching the channels required for the Z-axis slugs and X-Y conductors.

From the foregoing disclosure of a preferred construction and fabrication of a malleable interconnection wafer 14 in accordance with the invention for use in a multiwafer structure of the type illustrated in FIG. 1, it will now be evident how a component wafer 12 and a connector wafer 16 may also be provided. More specifically, it will be understood that the Z-slugs and X-Y conductors required for a component wafer 12 may be provided in the same manner as illustrated in FIGS. 3–6, with the components of the component wafer being provided as disclosed in the aforementioned U.S. Pat. No. 3,705,332. A connector wafer 16 ordinarily contains only Z-axis slugs and thus may be provided as illustrated in FIGS. 3–6 by eliminating X-Y conductors. In addition, dielectric paths 66 will have to be provided to prevent shorting of the flush X-Y conductors on an adjacent interconnection or compound wafer. Thus the X-Y conductors such as 54 may be formed on the wafer surface and by simply providing a corresponding sized and shaped dielectric area on the adjacent wafer surface, the X-Y conductor is insulated from the adjacent metal surface.

Another difference between the wafers of the present invention from those disclosed in the preferred embodiment of the aforementioned patent should also be noted. In the preferred embodiment of this patent, the malleable wafer-to-wafer Z-slug and grounding contacts are provided only on the opposite surfaces of the connector wafers, and not on either of the component and interconnection wafers. However, as will now be evident from FIGS. 3–6, greater economy is obtained for the preferred construction and fabrication method of the present invention by providing deformable integral malleable contacts on one side of each of the connector, component and interconnection wafers, although the invention is not to be considered as limited to such a construction.

In a typical embodiment of the invention, the housing 20 shown in FIG. 2 may have a vertical dimension on the order of 1.6 inches with the width and depth of the housing each being about 2.7 inches. The stack 10 might then have a vertical dimension of 0.9 inches and width and depth dimensions of 1.9 inches. A typical active circuit chip size might be on the order of 0.6 inches, thus allowing about four chips to be carried by a component wafer. In order to determine the wafer area (i.e., cell size) required for a circuit chip, allowance should be made for as many free (unconnected) Z-axis slugs as are necessary to interconnect system wafer logic above and below the cell. Generally, about 1.5 free Z-axis slugs are needed for each chip terminal. An exemplary circuit strip with forty-four leads, for example, would therefore need 44 X 2.5 = 110 Z-axis slugs for system interconnection. In a typical 12 by 12 matrix of slugs, 25 slugs, for example, may be aligned with the chips and therefore be unusable. The remaining 119 slugs would be available for circuit and system interconnection. The cell size required, therefore, is determined by the standardized 50-mil matrix of through-slugs and the factor 2.5 times the number of circuit leads. Assume that the 44-lead chip cell is $0.6 \times 0.6 = 0.36$ square inch in the plane of the wafer and 0.047 inch high. Since each chip has an average of two interconnection wafers associated with it, which may total 0.019 inch thick including the connector wafers and of the same cell area (0.36 inch square), the cell volume can be computed by multiplying cell area by the sum thicknesses of one interconnect wafer (typically, 0.019 inches), one component wafer (typically, 0.047 inches), and two connector screens (typically, 0.005 inches each), e.g., $0.36 \times (0.019 + 0.047 + 0.010) = 0.0276$ cubic inch/chip (36 chips/cubic inch).

Since a 44-lead MOS FEB chip may contain 100 gates or better, the circuit density in the wafer stack is typically 100/0.0276 = 3,600 gates/cubic inch.

It will thus be evident that although the invention has been primarily directed to a particular exemplary construction and fabrication method, the invention is subject to a wide variety of modifications and variations without departing from the scope of the invention as defined in the appended claims.

The embodiments of the invention in which, an exclusive property or privilege is claimed are defined as follows:

1. A method for fabricating a multiwafer electrical circuit structure including a plurality of pressure-stacked replaceable conductive wafers containing deformable malleable contacts between adjacent wafers for providing wafer-to-wafer connections, the improvement comprising the steps of:

providing each of said wafers from a malleable conductive material, selectively forming one of the opposed surfaces of one wafer to define a plurality of integral malleable metal contacts projecting from and integral with said one of the opposed surfaces of said one wafer, and depositing malleable contact areas on an adjacent surface of another wafer with each contact area in registration with a respective one of said integral metal contacts and having a greater area than the respective integral metal contact, and stacking said one wafer with said other wafer in a stack with each contact area engaging a respective one of said integral contacts under pressure to deform the integral malleable contacts on said one surface of said one wafer to thereby provide reliable wafer-to-wafer electrical connections.

2. The method claimed in claim 1 wherein said malleable conductive metal for each wafer is provided from a material having a Brinell hardness value within the range of 20 to 150.

3. The method claimed in claim 1, wherein the step of forming said malleable contacts is accomplished by selective chemical etching.

4. In the method claimed in claim 1, the step of forming a predetermined electrical circuit pattern within the profile of a selected wafer by selectively removing metal from opposite surface of said selected wafer; and replacing at least a portion of the removed metal with dielectric material for supporting and insulating the electrical circuit pattern from the remaining portions of the selected wafer.

5. In the method claimed in claim 1, the step of depositing a thin gold layer on each malleable contact, and the step of depositing thin gold layer areas on the adjacent surface of said other wafer for respectively receiving the malleable contacts of said one wafer when the wafers are stacked.

6. The method claimed in claim 4, wherein the step of forming a predetermined circuit pattern includes forming at least one elongated conductor extending parallel to the surface of said selected wafer and flush therewith, and wherein said method includes forming a dielectric channel in the surface of the adjacent wafer with said channel dimensioned to prevent shorting of said elongated conductor when the wafers are stacked.

7. A method of fabricating a conductive wafer containing a predetermined electrical circuit pattern for use in a pressure-stacked multiwafer electrical circuit structure, the improvement comprising the steps of:

providing a malleable conductive sheet, forming and insulating said predetermined electrical circuit pattern from said conductive sheet, removing material from a selected surface of said sheet to form malleable integral contacts in a predetermined pattern projecting from said sheet and an integral malleable contact on said predetermined electrical circuit pattern, choosing the malleability of said malleable conductive sheet so that the integral contacts deform when the sheet is pressure-stacked in said multi-wafer structure to thereby provide reliable wafer-to-wafer connections, depositing a thin gold layer on each malleable contact, depositing spaced thin gold layer areas on the surface of an adjacent sheet with each area in registry with a respective one of said integral malleable contacts and of larger area than the respective integral malleable contact, and stacking said malleable sheet and said adjacent sheet in said structure under pressure deforming said integral contacts with each gold layer on each integral contact engaging a respective thin gold layer area on the surface of said adjacent sheet.

8. The method claimed in claim 7, wherein said malleable conductive sheet is chosen from a material having a Brinell hardness value within the range of 20 to 150.

9. The method claimed in claim 7, wherein the step of forming said circuit pattern includes selectively removing material from opposite surfaces of said sheet and replacing at least a portion of the removed material with dielectric material in a manner so that said predetermined electrical circuit pattern as well as said malleable contacts are formed from the material of said sheet with said di electric material serving to support and electrically insulate said predetermined circuit pattern within the profile of said sheet.

10. The method claimed in claim 9, wherein said selective removing is accomplished by selective chemical etching.

11. The method claimed in claim 7, wherein said step of forming includes:

forming channels in one surface of said sheet having a pattern corresponding to said predetermined circuit pattern desired for said wafer, affixing dielectric material in said channels, and forming channels in the other surface of said sheet having a location and depth relative to the channels formed in said one surface so as to isolate from said sheet the portions constituting said predetermined electrical circuit.

12. The method claimed in claim 11, including selectively removing material from said other surface of said sheet so as to form said integral malleable contacts projecting therefrom.

13. The method claimed in claim 12, wherein said predetermined circuit pattern is formed so as to contain at least one elongated conductor extending parallel to said sheet and flush therewith.

14. The method as claimed in claim 12, including:

forming said circuit pattern with a portion coplanar with one surface of one sheet; and forming a channel in a surface of another sheet dimensioned and positioned to prevent shorting of said coplanar portion when said one and other sheets are stacked in adjacent postions.

15. The method claimed in claim 7, wherein said steps of forming said circuit pattern and removing the material comprises:

selectively chemically etching one surface of said sheet to form channels therein having a pattern corresponding to said predetermined circuit pattern, affixing dielectric in said channels, and selectively chemically etching the other surface of said sheet to form said integral malleable contacts projecting therefrom and to simultaneously form channels having a location and depth relative to the channels formed in said one surface to isolate from said sheet the portions constituting said predetermined electrical circuit pattern.

16. A multiwafter electrical circuit structure comprising:

a plurality of pressure-stacked replaceable malleable conductive metal wafers each having opposed surfaces with each opposed surface located adjacent a respective surface of an adjacent wafer, one of the opposed surfaces of one wafer having integral malleable contacts projecting therefrom, the respective surface of the adjacent wafer having deposited thereon spaced coplanar layer areas of malleable material with each layer area in registry with a respective one of said malleable contacts for engaging a respective one of said malleable contacts with the respective surface of each layer area having a greater area than the integral contact engaged therewith, the malleability of said metal being chosen so that said integral contacts deform when the wafers are stacked under pressure to thereby provide reliable electrical interconnections between said one wafer and said adjacent wafer.

17. The structure claimed in claim 16, wherein each malleable contact is provided with a thin gold layer and wherein thin gold layer areas are also provided on the respective surface of the adjacent wafer for respectively receiving the gold layer on the integral contacts projecting from said one wafer.

18. The structure claimed in claim 16, wherein said malleable conductive wafers are provided from a material having a Brinell hardness value within the range of 20 to 150.

19. In the structure claimed in claim 16, a predetermined pattern of through-connection conductors extending from said one surface of each wafer to the opposed surface of each wafer with one end of each through-connection conductor aligned with a respective end of a through-connection conductor on an adjacent wafer, a thin contact area deposited on one end of each through-connection conductor on one wafer, a dielectric material in each wafer supporting and electrically insulating each through-connection conductor from the respective wafer, and integral contacts each projecting from one end of respective aligned ones of said through-connection conductors on an adjacent wafer for electrically connecting aligned through-connection conductors when the wafers are stacked with the integral contacts on said adjacent wafer having a smaller surface area then the thin contact area deposited on the aligned through-connection conductor on said one wafer.

20. The structure claimed in claim 19, wherein said integral contacts are also provided on a wafer surface at locations between said through-connection conductors for providing wafer-to-wafer ground connections.

21. The structure claimed in claim 19, wherein each of a plurality of said conductive wafers includes at least one elongated conductor within the profile of the wafer extending parallel thereto and electrically connected to at least one of said through-connection conductors.

22. The structure claimed in claim 19, wherein said elongated conductor has a surface flush with a surface of its respective wafer, and wherein the opposed wafer surface of the adjacent wafer is provided with a dielectric channel dimensioned so as to prevent shorting of the elongated conductor when the wafers are stacked.

23. A first replaceable wafer useful in a pressure-stacked multiwafer electrical circuit structure including an adjacent replaceable wafer, said first wafer comprising:

a malleable conductive sheet having a Brinell hardness value within the range of 20 to 150, a plurality of through-connection conductors formed in said sheet, dielectric material supporting and electrically insulating said through-connection conductors from said sheet, a first plurality of integral malleable contacts each projecting from the end of a respective one of said through-connection conductors, a second plurality of integral malleable contacts projecting from the surface of said sheet at locations between said through-connection conductors, said adjacent wafer comprising a sheet with spaced conductors therein, a malleable layer area deposited on one surface of each conductor in said adjacent wafer in registry with a respective one of said first plurality malleable contacts for engagement under pressure with a respective one of said first plurality of malleable contacts to deform the respective malleable contact and having a larger surface area than the respective malleable contact, and a malleable layer area deposited on the surface of said adjacent wafer in registry with a respective one of said second plurality of malleable contacts for engagement under pressure with a respective contact of said second plurality to deform the respective contact of said second plurality and having a larger surface area than said respective contact of said second plurality.

24. In combination with the wafer claimed in claim 23, a thin gold layer on selected ones of said malleable contacts; and a second malleable conductive sheet having thin gold layer areas on one surface for respectively receiving the selected ones of said integral contacts.

25. In combination with the wafer claimed in claim 23, one elongated conductor within the profile of the sheet extending parallel thereto and electrically connected to at least one of said through-connection conductors, and a dielectric material insulating said elongated conductor from said sheet and supporting said elongated conductor on said sheet.

26. The combination claimed in claim 25, wherein said elongated conductor has a surface flush with a surface of the sheet, and wherein a second conductive sheet having a dielectric channel is also provided in registry with said elongated conductor and dimensioned to prevent shorting of a flush elongated conductor when the sheets are stacked.

27. The multiwafer electrical circuit structure comprising:

a stack including at least a first malleable replaceable metal wafer and a second replaceable malleable metal wafer with each wafer having a first surface and a second surface, the first surface of each wafer including a plurality of integrally formed malleable metal contacts projecting from the respective first surface with the first surface of the first wafer located adjacent and facing the second surface of the second wafer, a plurality of generally smooth substantially planar surface layer areas deposited on the second surface of each wafer, the smooth substantially planar surface layer areas on the second surface of said second wafer in registry with and abutting a respective one of the plurality of integrally formed contacts projecting from the first surface of the first wafer and having a surface area larger than the respective one of the integrally formed contacts, and means for applying pressure to said wafers for deforming the malleable metal contacts projecting from the first surface of said first wafer against said smooth substantially planar areas on the second surface of said second wafer.

* * * * *